United States Patent
Kim et al.

(10) Patent No.: US 6,998,643 B2
(45) Date of Patent: Feb. 14, 2006

(54) SILICON-BASED LIGHT EMITTING DIODE

(75) Inventors: Taeyoub Kim, Seoul (KR); Nae Man Park, Daejeon (KR); Gun Yong Sung, Daejeon (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/923,230

(22) Filed: Aug. 20, 2004

(65) Prior Publication Data

US 2005/0139847 A1    Jun. 30, 2005

(30) Foreign Application Priority Data

Dec. 24, 2003   (KR) ..................... 10-2003-0096218

(51) Int. Cl.
   *H01L 27/15*   (2006.01)
(52) U.S. Cl. .......................................... 257/86; 438/22
(58) Field of Classification Search ................. 257/21, 257/22, 79, 82–86, 88, 98, 184, 432; 438/22, 438/29, 32

See application file for complete search history.

(56) References Cited

U.S. PATENT DOCUMENTS 5,229,627 A * 7/1993 Kosaka ................. 257/85

FOREIGN PATENT DOCUMENTS

KR   1020020023117 A   3/2002

OTHER PUBLICATIONS

Applied Physics Letters, vol. 77, No. 4, Jul. 24, 2000, pp. 522-524.

* cited by examiner

*Primary Examiner*—David Vu
(74) *Attorney, Agent, or Firm*—Blakely Sokoloff Taylor & Zafman

(57) ABSTRACT

A silicon-based light emitting diode simultaneously adopts doping layers and Distributed Bragg Reflector (DBR). The silicon-based light emitting diode includes an active layer having mutually opposing a first side and a second side. A first reflecting portion faces with the first side of the active layer, and a second reflecting portion faces with the second side of the active layer. A first doping layer is interposed between the active layer and the first reflecting portion. A second doping layer is interposed between the active layer and the second reflecting portion. A first electrode is electrically connectable to the first doping layer, and a second electrode is electrically connectable to the second doping layer. Here, At least one of the first reflecting portion and the second reflecting portion has the DBR that is formed by alternately stacking two kinds of differently composed silicon-containing insulating layers and a gate.

15 Claims, 1 Drawing Sheet

SILICON-BASED LIGHT EMITTING DIODE

BACKGROUND OF THE INVENTION

This application claims the priority of Korean Patent Application No. 2003-96218, filed on Dec. 24, 2003, in the Korean Intellectual Property Office, the disclosure of which is incorporated herein in its entirety by reference.

1. Field of the Invention

The present invention relates to a method of manufacturing a semiconductor device, and more particularly to a silicon-based light emitting diode provided with a Distributed Brag Reflector (BDR).

2. Description of the Related Art

Silicon-based light emitting diodes utilizing silicon nano-size dots have been widely studied because of excellent compatibility with other silicon-based photoelectron devices and low manufacturing cost. However, it is difficult to apply silicon-based light emitting diodes up to now due to low luminous efficiency and wide emission spectrum.

Respective optical devices, which include a luminous function, an optical detection function and an optical modulation function, employ a DBR with high reflectance. The DBR obtained by alternately stacking two kinds of materials with different refractive indices is a reflecting mirror that reflects light using a difference of refractive indices of two materials.

In a compound semiconductor-based emitting diode, a doping material is implanted into a DBR, thereby obtaining high luminous efficiency and a narrow emission spectrum. However, because an insulating material such as a silicon oxide or a silicon nitride should be used as the DBR in accordance with base materials including an active layer, the silicon-based light emitting diode that uses silicon nano-size dots has a problem in directly doping to the DBR.

SUMMARY OF THE INVENTION

The present invention provides a silicon-based light emitting diode with a new structure that uses a doping layer and a DBR without directly doping to the DBR, thereby embodying high luminous efficiency and narrow emission spectrum.

According to the present invention, there is provided a silicon-based light emitting diode including an active layer formed on a substrate, which has mutually opposing a first side and a second side. A first reflecting portion faces with the first side of the active layer, and a second reflecting portion faces with the second side of the active layer. A first doping layer is interposed between the active layer and the first reflecting portion, and a second doping layer is interposed between the active layer and the second reflecting portion. Also, a first electrode electrically connectable to the first doping layer, and a second electrode electrically connectable to the second doping layer are included. At least one of the first reflecting portion and the second reflecting portion has a DBR formed by alternately stacking two kinds of differently composed silicon-containing insulating layers and a gate.

Here, the gate is formed by penetrating through the DBR, thereby migrating carriers to the first doping layer or the second doping layer.

Preferably, the active layer is formed of crystalline or amorphous silicon nano-based dots.

According to one aspect of the present invention, the first reflecting portion and the second reflecting portion respectively include the DBRs formed by alternately stacking two kinds of differently composed silicon-containing insulating layers and the gates formed by penetrating through the DBRs.

According to another aspect of the present invention, the first reflecting portion and the second reflecting portion respectively include the DBRs formed by alternately stacking two kinds of differently composed silicon-containing insulating layers and the gates formed by penetrating through the DBR. The second reflecting portion is formed of a total internal reflection metal layer. Here, the total internal reflection metal layer is in contact with the substrate.

Preferably, two kinds of silicon-containing insulating layers that form the DBRs are formed of the first electrode and the second electrode, and a difference of refractive indices between the first insulating layer and the second insulating layer is 0.1~1.5. The first insulating layer and the second insulating layer are alternately stacked for plural times, thereby constituting the DBR. The first insulating layer and the second insulating layer may be respectively formed of a silicon oxide layer, a silicon nitride layer or a composite layer of the two layers. Preferably, the first insulating layer and the second insulating layer are formed of a first silicon oxide layer and a second silicon oxide layer that respectively have different compositions. More preferably, the first insulating layer and the second insulating layer are formed of a first silicon nitride layer and a second silicon nitride layer that respectively have different compositions.

The silicon-based light emitting diode according to the present invention can obtain high luminous efficiency, narrow emission spectrum and stable operating characteristics, thereby enhancing electroluminescence characteristics.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

In order to enhance performance of a light emitting diode, not only an active layer that produces light but also a doping layer that implants carriers, a reflecting portion that effectively emits the light, and a structural arrangement of these are important. Particularly, a silicon-based light emitting diode that utilizes silicon nano-size dots has relatively weak self-luminance, so that the doping layer, the reflecting portion and the effective structural arrangement are more important.

Figure 1:
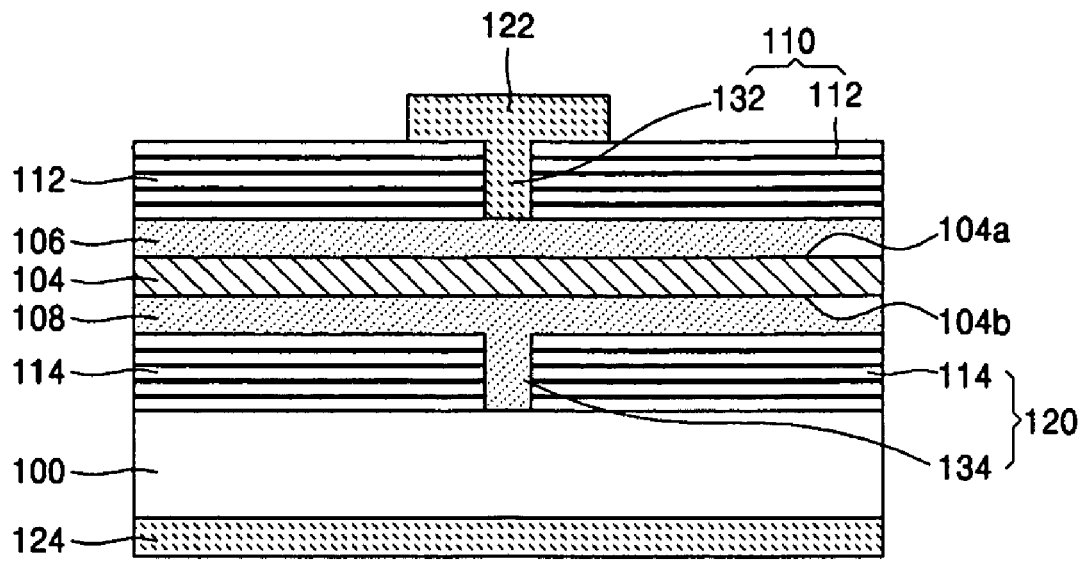
FIG. 1 is a sectional view showing a major portion of a silicon-based light emitting diode according to a first embodiment of the present invention.

FIG. 1 is a sectional view showing a major portion of the silicon-based light emitting diode according to a first embodiment of the present invention.

Referring to FIG. 1, the silicon-based light emitting diode according to the first embodiment of the present invention includes an active layer 104 that has a first side 104a and a second side 104b which mutually oppose each other formed on a substrate 100. The active layer 104 is formed of crystalline or amorphous silicon nano-size dots. Preferably, the active layer 104 has a thickness of 150 $\mu$m~30 nm.

The first side 104a of the active layer 104 faces with a first reflecting portion 110. Also, the second side 104b of the active layer 104 faces with a second reflecting portion 120.

A first doping layer 106 is interposed between the active layer 104 and the first reflecting portion 110. Also, a second doping layer 108 is interposed between the active layer 104 and the second reflecting portion 120.

A first electrode 122 is formed to be electrically connected to the first doping layer 106, and a second electrode 124 is electrically connected to the second doping layer 108. Preferably, the first electrode 122 and the second electrode 124 are formed of a metal. More preferably, the first electrode 122 and the second electrode 124 respectively have a thickness of 100 $\mu$m~5 mm.

Referring to a construction shown in FIG. 1, the first reflecting portion 110 includes a first DBR 112 formed by alternately stacking two kinds of silicon-containing insulating layers that have different compositions. The second reflecting portion 120 includes a second DBR 114 formed by alternately stacking two kinds of silicon-containing insulating layers that have different compositions. In connection with the first DBR 112 and the second DBR 114, the two kinds of silicon-containing insulating layers having different compositions preferably have a refractive index difference of about 0.1~1.5. The first DBR 112 and the second DBR 114 may be respectively formed of a silicon oxide layer, a silicon nitride layer, or a layer combining the two layers. More preferably, the first DBR 112 and the second DBR 114 have a structure of alternately stacking a differently composed first silicon oxide layer and a second silicon oxide layer multiple times, or of alternately stacking a differently composed first silicon nitride layer and a second silicon nitride layer for multiple times. For example, the first DBR 112 and the second DBR 114 respectively formed by stacking the stacked structure of the first and second silicon oxide layers or of the first and second silicon nitride layers in 2~20 pairs.

The first reflecting portion 110 is formed with a first gate 132 that penetrates through the first DBR 112. The second reflecting portion 120 is formed with a second gate 134 that penetrates through the second DBR 114. The first gate 132 acts to migrate the carriers consisting of electrons or holes toward the first doping layer 106. Also, the second gate 134 acts to migrate the carriers toward the second doping layer 108. Preferably, the first gate 132 and the second gate 134 respectively have widths of 1~500 $\mu$m.

In the construction as shown in FIG. 1, once the first electrode 122 and the second electrode 124 are supplied with current, the carriers that consist of electrons or holes reach the first doping layer 106 and the second doping layer 108 through the first DBR 112 and the second DBR 114. Here, because the first DBR 112 and the second DBR 114 are respectively formed of the insulating material of the silicon oxide layer or the silicon nitride layer, the first gate 132 and the second gate 134, which penetrate through the first DBR 112 and the second DBR 114, must be formed to allow the carriers to reach the first doping layer 106 and the second doping layer 108. Here, the first doping layer 106 and the second doping layer 108 function by effectively implanting the carriers to the active layer 104. Then, the active layer 104 implanted with the carriers emits light itself at the silicon nano-based dots. The light emitted as above is confined among the active layer 104 and both the first DBR 112 and the second DBR 114, which are respectively disposed on both sides of the first and second doping layers 106 and 108. Therefore, the carriers vibrate to selectively amplify and discharge the spectrum of a narrow region.

Figure 2:
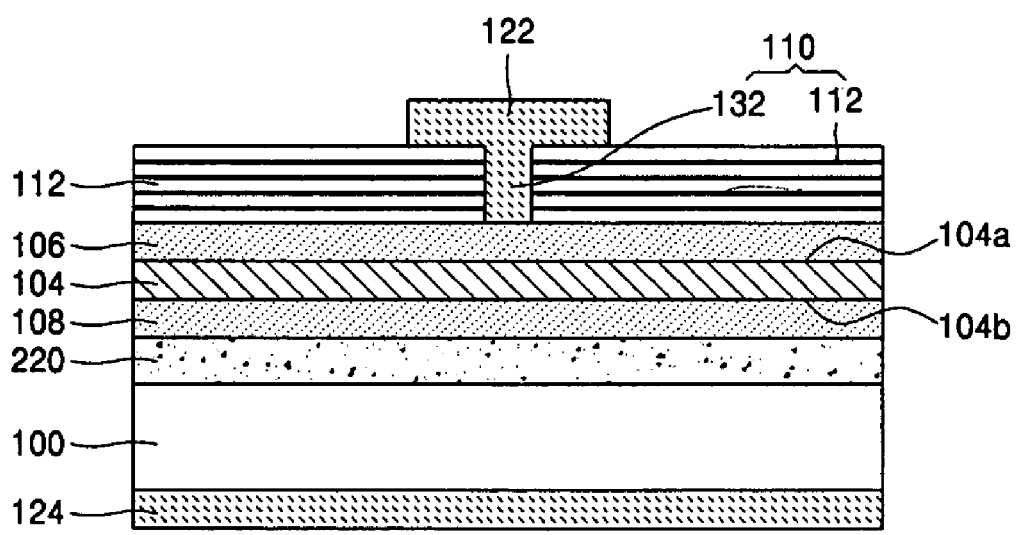
FIG. 2 is a sectional view showing a major portion of the silicon-based light emitting diode according to a second embodiment of the present invention.

FIG. 2 is a sectional view showing a major portion of the silicon-based light emitting diode according to a second embodiment of the present invention.

The second embodiment is mostly similar to the first embodiment, which is however different from the first embodiment in that a second reflecting portion 220 is formed of a total internal reflection metal layer. In other words, the first reflecting portion 110 includes the DBR 112 obtained by alternately stacking two kinds of silicon-containing insulating layers with different compositions and the gate 132 formed by penetrating through the DBR 112. Then, the second reflecting portion 220 is formed of the total internal reflecting metal layer. In FIG. 2, like reference numerals of the first embodiment designate the same parts with no specific description.

Referring to FIG. 2, upon applying current to the first electrode 122 and the second electrode 124, the carriers consisting of electrons or holes reach the first doping layer 106 through the first DBR 112. The first doping layer 106 acts to effectively implant the carriers to the active layer 104. Then, the active layer 104 implanted with the carriers self-emits the light at the silicon nano-based dots. The light emitted as above is confined within the active layer 104 and the first DBR 112 and the second reflecting portion 220, which are disposed between the sides of the first doping layer 106 and the second doping layer 108. By doing so, the carriers are vibrated to thereby selectively amplify and discharge the spectrum of the narrow region.

The silicon-based light emitting diode according to the present invention is formed such that the doping layers and the DBRs are simultaneously employed in order to enhance performance of the light emitting diode that uses the silicon nano-based dots as the active layer. Here, the silicon-based light emitting diode has high luminous efficiency, narrow emission spectrum and stable operating characteristics, thereby enhancing electroluminescence characteristics of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A silicon-based light emitting diode comprising:
   an active layer formed on a substrate and having mutually opposing a first side and a second side;
   a first reflecting portion facing the first side of the active layer;
   a second reflecting portion facing the second side of the active layer;
   a first doping layer interposed between the active layer and the first reflecting portion;
   a second doping layer interposed between the active layer and the second reflecting portion;
   a first electrode electrically connectable to the first doping layer; and
   a second electrode electrically connectable to the second doping layer, wherein at least one of the first reflecting portion and the second reflecting portion has a Distributed Bragg Deflector (DBR) formed by alternately stacking two kinds of differently composed silicon-containing insulating layers and a gate.

2. The silicon-based light emitting diode as claimed in claim 1, wherein the gate is formed by penetrating through the DBR, thereby migrating carriers to the first doping layer or the second doping layer.

3. The silicon-based light emitting diode as claimed in claim 2, wherein the gate has a width of 1~500 $\mu$m.

4. The silicon-based light emitting diode as claimed in claim 1, wherein the active layer is formed of crystalline silicon nano-based dots.

5. The silicon-based light emitting diode as claimed in claim 1, wherein the active layer is formed of amorphous silicon nano-based dots.

6. The silicon-based light emitting diode as claimed in claim 1, wherein the active layer has a thickness of 150 μm~30 nm.

7. The silicon-based light emitting diode as claimed in claim 1, wherein the first reflecting portion and the second reflecting portion respectively comprise the DBRs formed by alternately stacking two kinds of differently composed silicon-containing insulating layers and the gates formed by penetrating through the DBRs.

8. The silicon-based light emitting diode as claimed in claim 1, wherein the first reflecting portion and the second reflecting portion respectively comprise the DBRs formed by alternately stacking two kinds of differently composed silicon-containing insulating layers and the gates formed by penetrating through the DBRs, and
the second reflecting portion is formed of a total internal reflection metal layer.

9. The silicon-based light emitting diode as claimed in claim 8, wherein the total internal reflection metal layer is in contact with the substrate.

10. The silicon-based light emitting diode as claimed in claim 1, wherein the first electrode and the second electrode are respectively formed of metal layers having a thickness of 100 μm~5 mm.

11. The silicon-based light emitting diode as claimed in claim 1, wherein the two kinds of silicon-containing insulating layers that form the DBR are formed of a first insulating layer and a second insulating layer, and a difference of refractive indices between the first insulating layer and the second insulating layer is 0.1~1.5.

12. The silicon-based light emitting diode as claimed in claim 11, wherein the first insulating layer and the second insulating layer are respectively formed of one of a silicon oxide layer, a silicon nitride layer and a composite layer of the two layers.

13. The silicon-based light emitting diode as claimed in claim 12, wherein the first insulating layer and the second insulating layer are formed of a first silicon oxide layer and a second silicon oxide layer that respectively have different compositions.

14. The silicon-based light emitting diode as claimed in claim 12, wherein the first insulating layer and the second insulating layer are formed of a first silicon nitride layer and a second silicon nitride layer that respectively have different compositions.

15. The silicon-based light emitting diode as claimed in claim 12, wherein the DBR comprises a stacked structure formed by stacking the first insulating layer and the second insulating layer in 2~20 pairs.

* * * * *